US011626027B2

(12) United States Patent
Lovegrove

(10) Patent No.: US 11,626,027 B2
(45) Date of Patent: Apr. 11, 2023

(54) CLASSIFYING POSSESSION OR CONTROL OF TARGET ASSETS

(71) Applicant: Morphix, Inc., Vancouver, WA (US)

(72) Inventor: Jonathan Lovegrove, Yacolt, WA (US)

(73) Assignee: MORPHIX, INC., Vancouver, WA (US)

( * ) Notice: Subject to any disclaimer, the term of this patent is extended or adjusted under 35 U.S.C. 154(b) by 54 days.

(21) Appl. No.: 17/473,858

(22) Filed: Sep. 13, 2021

(65) Prior Publication Data

US 2023/0083636 A1 Mar. 16, 2023

(51) Int. Cl.
*G09B 9/00* (2006.01)
*G06F 30/27* (2020.01)

(52) U.S. Cl.
CPC ............. *G09B 9/003* (2013.01); *G06F 30/27* (2020.01)

(58) Field of Classification Search
CPC . G09B 9/00; G09B 9/003; G09B 9/02; G09B 9/04; G09B 9/05; G09B 9/052; G09B 9/06; G09B 9/08; G09B 9/085; G06F 30/27
See application file for complete search history.

(56) References Cited

U.S. PATENT DOCUMENTS

| | | | | |
|---|---|---|---|---|
| 2010/0316977 | A1* | 12/2010 | Gordon | G09B 9/003 434/11 |
| 2018/0374380 | A1* | 12/2018 | Ford | F41A 33/02 |
| 2019/0258251 | A1 | 8/2019 | Ditty et al. | |
| 2021/0343177 | A1* | 11/2021 | Coppersmith, III | G09B 9/003 |

OTHER PUBLICATIONS

Ezeme, O. et al., "A Deep Learning Approach to Distributed Anomaly Detection for Edge Computing," Proceedings of the 2019 18th IEEE International Conference on Machine Learning and Applications (ICMLA), Dec. 16, 2019, Boca Raton, Florida, 8 pages.

* cited by examiner

*Primary Examiner* — Timothy A Musselman
(74) *Attorney, Agent, or Firm* — Alleman Hall Creasman & Tuttle LLP

(57) ABSTRACT

Examples are disclosed that relate to methods and systems for classifying the possession or control of a target asset. One example provides a system comprising one or more computing devices having processors and associated memories storing instructions executable by the processors. The instructions are executable to conduct a simulation or observation of an in-field event comprising a plurality of actors controlling a plurality of in-field assets. The system is further configured to monitor telemetry data from each of the in-field assets. In addition, tagging data is received from an in-field asset under the control of a member of the friendly group. A training data set is generated including the telemetry data and the tagging data, and an artificial intelligence model is trained to predict whether a run-time target asset is in the possession or control of the friendly or the unfriendly actor, or lost, based on run-time telemetry data.

20 Claims, 9 Drawing Sheets

*TRAINING THE AI MODEL*

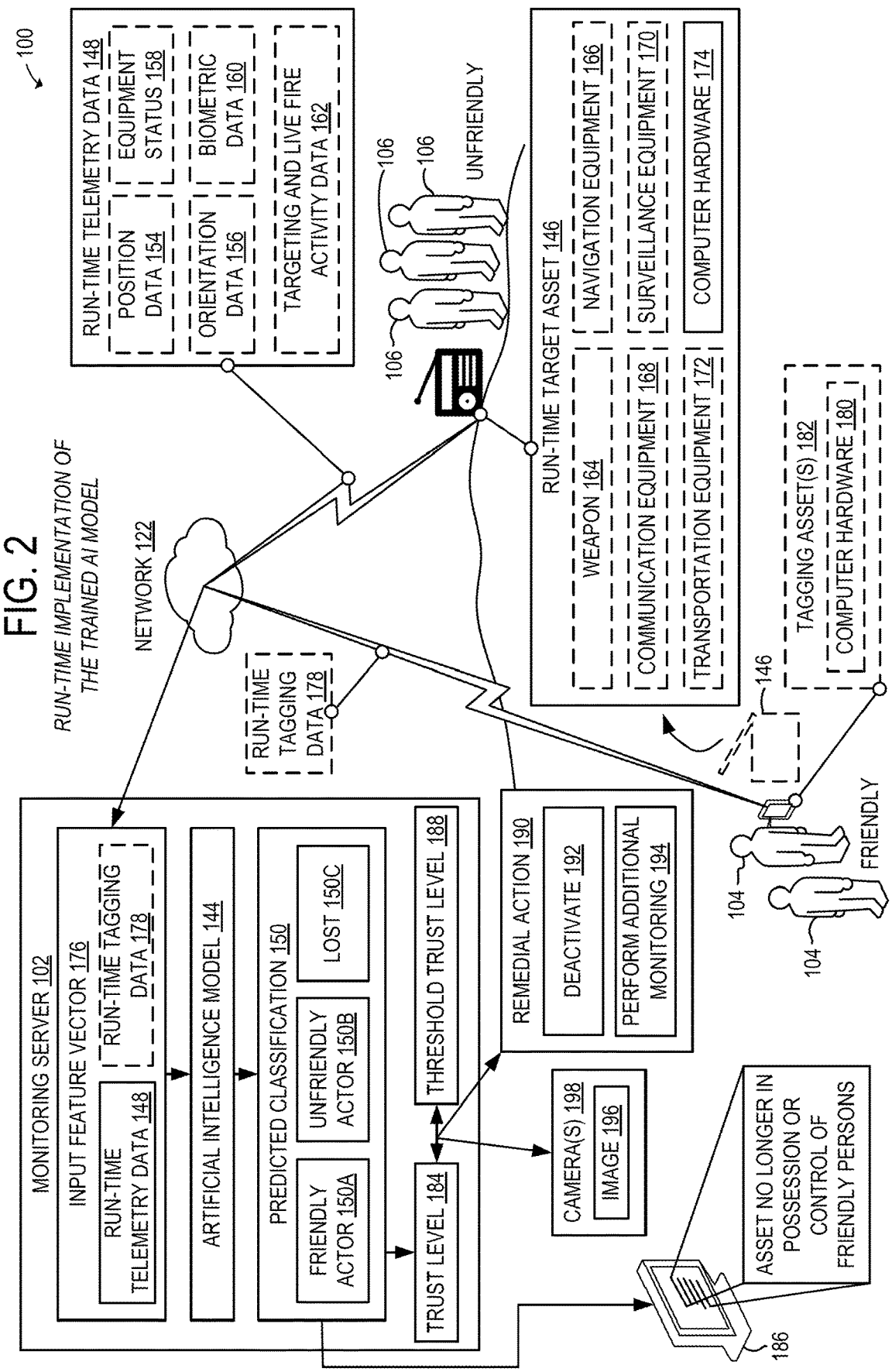

*TRAINING THE OUTLIER DETECTION MODEL*

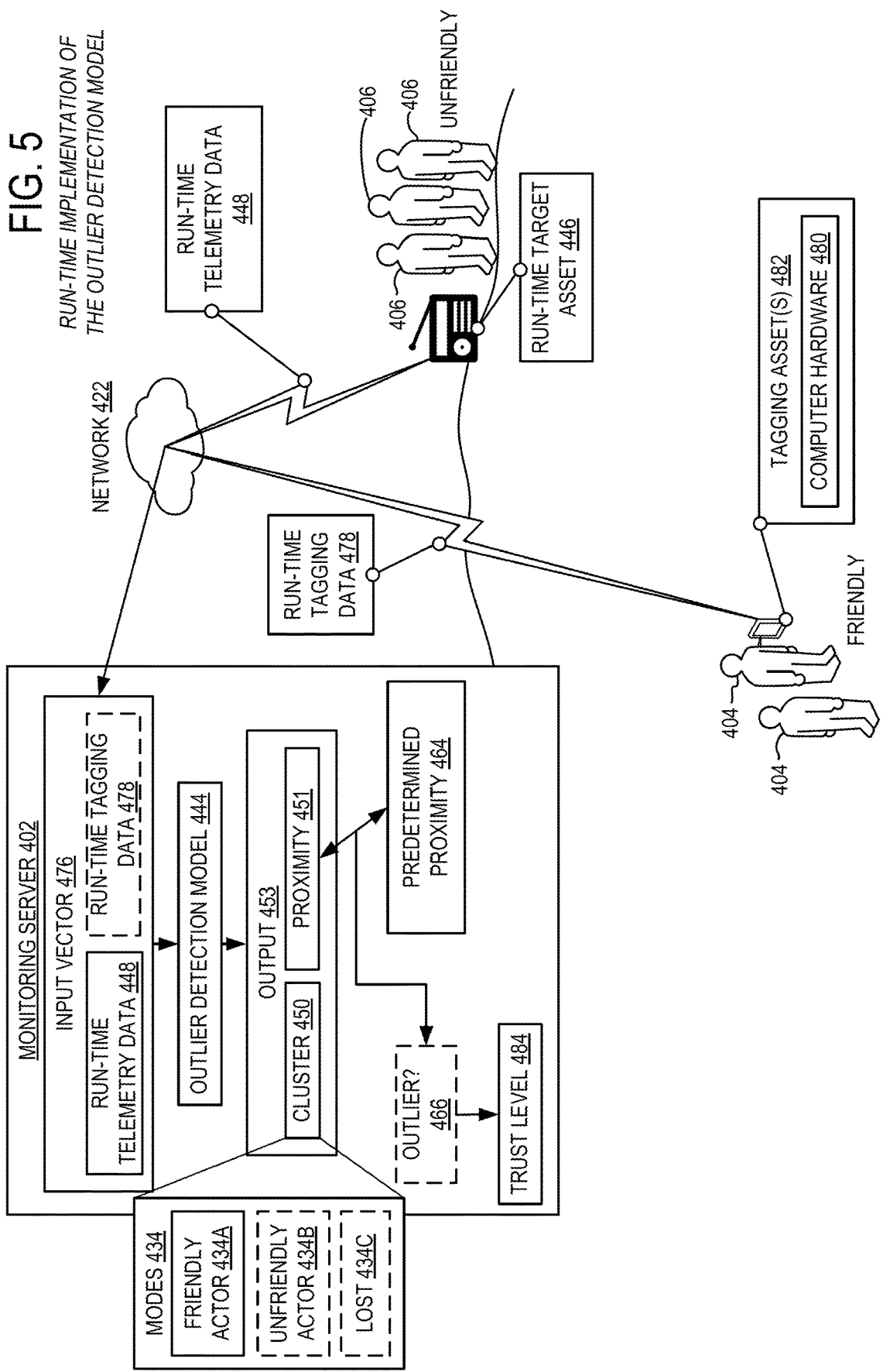

CLASSIFYING POSSESSION OR CONTROL OF TARGET ASSETS

BACKGROUND

Versatile field assets, such as computing devices, tools, weapons, machinery, and other equipment that is interoperable between friendly users may be important in military, emergency response (e.g., police, fire, and emergency medical services), construction, natural resource extraction (e.g., logging and mining), and other organizations. However, it can be challenging to preserve such versatility while preventing field assets from being stolen and used by an unfriendly actor, spoofed, or otherwise compromised.

SUMMARY

In view of the issues discussed above, according to one aspect of the present disclosure, a system is provided for classifying the possession or control of a target asset. The system comprises one or more computing devices having processors and associated memories storing instructions executable by the processors. The instructions are executable to, at a training time, conduct a simulation or observation of an in-field event comprising a plurality of actors controlling a plurality of in-field assets. The in-field assets each comprise computer hardware, and the in-field assets include weapons, navigation equipment, communication equipment, surveillance equipment, and/or transportation equipment. The actors are members of either a friendly group or an unfriendly group, and the computer hardware of the in-field assets of the members of the friendly group is configured to communicate with a server system via a computer network. The system is further configured to monitor telemetry data from the computer hardware of each of the in-field assets of the members of the friendly group during the in-field event. The telemetry data includes one or more of position data of the asset, orientation data of the asset, equipment status of the asset, and biometric data of an authorized user of the asset. In addition, tagging data is received from computer hardware of an in-field asset under the control of a member of the friendly group indicating that a target in-field asset is in the possession or control of a friendly or unfriendly actor, or lost. A training data set is generated including the telemetry data and the tagging data, and an artificial intelligence model is trained using the training data set to predict whether a run-time target asset is in the possession or control of the friendly or the unfriendly actor, or lost, based on run-time telemetry data. At run-time, the run-time telemetry data from the run-time target asset is monitored during a run-time in-field event. The run-time telemetry data is input into the trained artificial intelligence model, to thereby cause the artificial intelligence model to output a predicted classification of the run-time target asset as being in the possession or control of the friendly or the unfriendly actor, or lost.

According to another aspect of the present disclosure, another system is provided for classifying the possession or control of a target asset. The system comprises one or more computing devices having processors and associated memories storing instructions executable by the processors. The instructions are executable to, at a training time, conduct a simulation or observation of an in-field event comprising a plurality of actors controlling a plurality of in-field assets. The in-field assets each comprise computer hardware, and the in-field assets include weapons, navigation equipment, communication equipment, surveillance equipment, and/or transportation equipment. The actors are members of either a friendly group or an unfriendly group, and the computer hardware of the in-field assets of the members of the friendly group is configured to communicate with a server system via a computer network. The system is further configured to monitor telemetry data from the computer hardware of each of the in-field assets of the members of the friendly group during the in-field event. The telemetry data includes one or more of position data of the asset, orientation data of the asset, equipment status of the asset, and biometric data of an authorized user of the asset. A training data set is generated including the telemetry data, and an outlier detection model is trained using the training data set to learn one or more modes in the training data set. The one or more modes include a mode corresponding to an in-field asset that is in the possession or control of a friendly actor. At run-time, run-time telemetry data from a run-time target asset is monitored during a run-time in-field event. The run-time telemetry data is input into the trained outlier detection model, to thereby cause the outlier detection model to output an indication of whether the run-time telemetry data is within a predetermined data distance of a centroid of a cluster defining the mode corresponding to the in-field asset that is in the possession or control of the friendly actor, or the run-time telemetry data is an outlier from the mode. Upon outputting the predicted classification of the run-time target asset as being the outlier from the mode, the system is configured to reduce a trust level of the run-time target computing device.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 2 shows one example of a run-time implementation of the system of FIG. 1.

FIG. 5 shows an example of a run-time implementation of the system of FIG. 4.

DETAILED DESCRIPTION

As introduced above, versatile field assets, such as computing devices, tools, weapons, machinery, and other equipment that is interoperable between friendly users may be important in military, emergency response (e.g., police, fire, and emergency medical services), construction, natural resource extraction (e.g., logging and mining), and other organizations. However, it can be challenging to preserve such versatility while preventing field assets from being stolen and used by an unfriendly actor, spoofed, or otherwise compromised.

For example, a soldier may want to be able to borrow another soldier's weapon, scope, goggles, etc. while preventing that equipment from being taken and used by an enemy. As another example, a construction firm may provide tools and other equipment for its employees in the field. However, that equipment can be vulnerable to theft.

Figure 1:
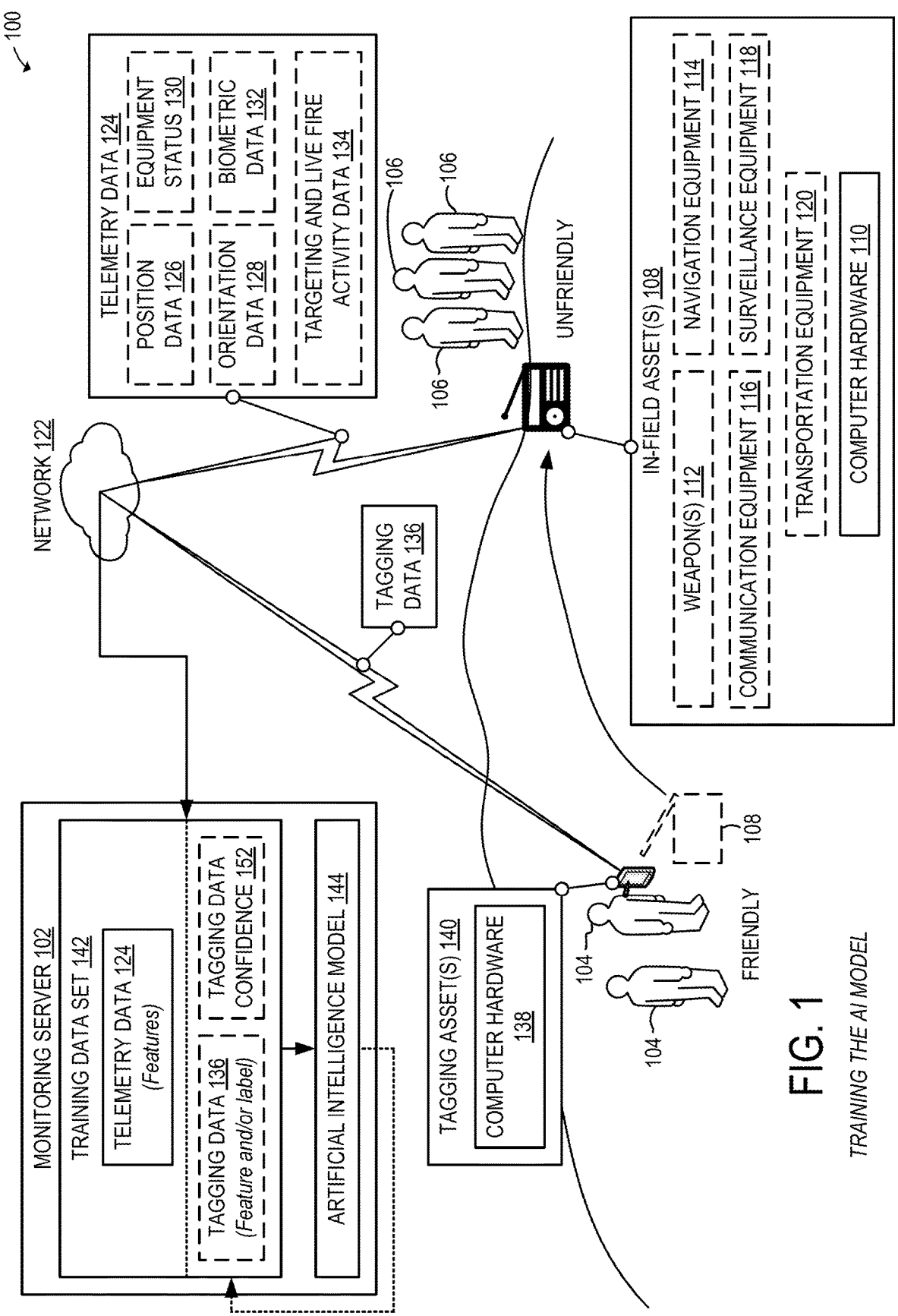
FIG. 1 shows one example of a system for classifying the possession or control of a target asset during a training-time simulation or observation of an in-field event comprising a plurality of actors controlling a plurality of in-field assets.

To address these challenges, and with reference now to FIG. 1, a system 100 is provided for classifying the possession or control of a target asset. The system 100 comprises one or more computing devices having processors and associated memories storing instructions executable by the processors. In the example of FIG. 1, the one or more computing devices take the form of a monitoring server 102. It will also be appreciated that the one or more computing devices may comprise any other suitable type of computing device. Additional details regarding the computing hardware of the monitoring server 102 are provided below with reference to FIG. 7.

The instructions are executable to, at a training time, conduct a simulation or observation of an in-field event comprising a plurality of actors 104, 106 controlling a plurality of in-field assets 108. In some examples, the in-field event is simulated in silico at the monitoring server 102 or another suitable computing device. In other examples, the in-field event is simulated in a real-world environment. For example, the in-field event may comprise a military field training exercise, an emergency response training drill (e.g., a firefighter training drill), etc. that is observed by the in-field event. In yet other examples, the in-field event is an active in-field event (e.g., a "real" or non-simulated event) that is observed by the monitoring server 102.

The in-field assets 108 each comprise computer hardware 110, and the in-field assets 108 include weapons 112, navigation equipment 114 (e.g., a GPS device), communication equipment 116 (e.g., a satellite phone or a radio), surveillance equipment 118 (e.g., a spotting scope, binoculars, or a drone), and/or transportation equipment 120 (e.g., a vehicle, such as a truck or an aircraft). The in-field assets 108 may include any suitable equipment or other assets. The actors 104, 106 are members of either a friendly group or an unfriendly group. In the example shown in FIG. 1, the unfriendly actors 106 possess one or more in-field assets 108 that were formerly in the possession and control of the friendly actors 104. Other actors may be present from other groups, such as a neutral group, in some scenarios.

The computer hardware 110 of the in-field assets 108 of the members 104 of the friendly group is configured to communicate with the server system 102 via a computer network 122. Additional details regarding the computing hardware 110 and the network 122 are provided below with reference to FIG. 7.

Accordingly, the monitoring server 102 monitors telemetry data 124 from the computer hardware 110 of each of the in-field assets 108 of the members 104 of the friendly group during the in-field event. The telemetry data 124 includes one or more of position data 126 (e.g., GPS data or inertial data) of the asset, orientation data 128 (e.g., as provided by an inertial measurement unit (IMU)) of the asset, an equipment status 130 of the asset, and biometric data 132 of an authorized user of the asset.

In some examples, monitoring the telemetry data 124 comprises monitoring targeting and live fire activity data 134 of members 104, 106 of the friendly group and unfriendly group (respectively) during the in-field event. For a weapon 112, the targeting and live fire activity data 134 may include a trigger pull indication, a safety setting (e.g. safe/semi-automatic/automatic), a number of rounds fired, an ammunition level, a direction the weapon is pointed, etc. The targeting and live fire activity data 134 may help indicate whether an asset is in possession of the friendly group or the unfriendly group. For example, weapons that are in the possession and control of the friendly group may spend most of their time (e.g., 80% of the time) pointed at and/or firing at the unfriendly actors 106 and avoid pointing at friendly actors 104. On the other hand, weapons that are in the possession and control of the unfriendly group may spend most of their time pointed at and/or firing at the friendly actors 104 while avoiding the other unfriendly actors 106.

The telemetry data 124 may additionally or alternatively include any other suitable data available on the asset 108. Other examples of suitable data include audio data (e.g., audio of a voice chat indicating that the asset 108 was stolen), avionics data (e.g., aircraft attitude, airspeed, or other aircraft performance parameters), and networking data. For example, the asset 108 may self-identify with a local mesh of devices, and the telemetry data 124 may include a location of the asset 108 within the local mesh network and the asset's connections to other devices. A suspicious pattern of network connections may indicate that the asset 108 has been stolen or otherwise compromised.

As another example, the in-field asset 108 may comprise an unmanned aerial vehicle or a drone. The drone may include various examples of navigation equipment 114, such as a GPS or IMU, which may be configured to provide position data 126 and orientation data 128 to the monitoring server 102. The drone may also include surveillance equipment 118, such as a live video feed of the field environment below the drone. The telemetry data 124 provided by this equipment can indicate whether the drone has been compromised or not. For example, one or more members 106 of the unfriendly group may hijack the drone (e.g., by hacking its flight control systems) and send it on a new flight path that differs from commands being provided by members 104 of the friendly group. In this example, the position data 126 or orientation data 128 from the drone (e.g., as provided by the GPS and/or IMU) may indicate that the drone is on a different flight path, which may trigger an indication of suspicion.

As yet another example, the unfriendly group may spoof at least a portion of the telemetry data 124. For example, the position data 126 may be spoofed to indicate that one or more in-field assets 108, such as a drone, is at a different geolocation. For example, the position data 126 may indicate that the drone has flown 500 nautical miles in one hour, when the drone has been captured by the unfriendly group and has been idling on the ground instead of flying. In this example, an equipment status 130 may not correspond to the position data 126 of an asset under friendly control. For example, the equipment status 130 may indicate that a fuel burn rate of the drone's engine is too low for the engine to support powered flight. As another example, the telemetry data 124 may place the drone outside of its maximum operational range (e.g., past a distance where it would have run out of fuel). By observing these inputs, the monitoring server 102 may determine that the telemetry data 124 has been tampered with or that the drone is experiencing one or more system malfunctions.

In addition, the monitoring server 102 is configured to receive tagging data 136 from computer hardware 138 of one or more in-field tagging assets 140 under the control of a member 104 of the friendly group indicating that a target in-field asset (e.g. one of the one or more in-field assets 108) is in the possession or control of a friendly or unfriendly actor, or lost. The one or more tagging assets 140 may include any suitable equipment or other assets that are under the control of at least one member of the friendly group. For example, the one or more tagging assets 140 may include one or more weapons, navigation equipment, communication equipment, surveillance equipment, transportation equipment, etc. The computing hardware 138 of the one or more tagging assets 140 is configured to transmit the tagging data 136 to the monitoring server 102 via the network 122. Additional details regarding the computing hardware 138 are provided below with reference to FIG. 7.

In some examples, the tagging data 136 includes a location of the target asset or an azimuth from the tagging asset to the target asset. The tagging data 136 may additionally or alternatively include target classification data indicating that a target in-field asset is in the possession or control of a friendly or unfriendly actor, or lost. Additional examples of the tagging data 136 are described in U.S. patent application Ser. No. 17/338,885, filed Jun. 4, 2021, and entitled "TARGET CLASSIFICATION SYSTEM", the entirety of which is hereby incorporated by reference for all purposes.

The monitoring server 102 is configured to generate a training data set 142 including the telemetry data 124 and the tagging data 136. The training data set 142 is used to train an artificial intelligence model 144 to predict whether a run-time target asset 146 is in the possession or control of the friendly 104 or the unfriendly actor 106, or lost, based on run-time telemetry data 148, as illustrated in FIG. 2.

It will be appreciated that the particular set of features included in the training data set 142 during the training phase will be included for each and every training session and in-field asset, and will also be included in the input vector in the run time phase, with the presence of each condition indicated on a normalized scale of zero to one. Thus, if position data 126 is being obtained for two different in-field assets 108, then entries in the training data set 142 will be included for each of these two different assets in each training session. When a particular feature is present in one session or the telemetry data of one device, but is not present in another session or from another device, it will be indicated as zero when it is not present.

In some examples, the tagging data 136 comprises a ground-truth classification for the telemetry data 124, which can be used to supervise the training of the artificial intelligence model 144 such that the artificial intelligence model outputs the ground-truth classification when the telemetry data 124 is provided as input. In other examples, the tagging data 136 may not comprise a 100% confident ground-truth classification. For example, tagging data 136 obtained using a drone that provides lower resolution images of the simulated or observed in-field event may have a lower associated confidence value 152 than tagging data 136 obtained using a drone that provides higher resolution images. Accordingly, when the tagging data 136 is used as a training output, the artificial intelligence model may be trained to output the classification provided by the tagging data 136 with an output confidence value equal to the confidence value 152 of the tagging data 136. For example, the connections between neurons of a neural network may be weighted to output a predicted classification based upon input telemetry data that corresponds to the tagging data and its associated confidence level.

Alternatively, the tagging data 136 may be independent of the training data set 142 (e.g., not input to the artificial intelligence model or used as a training-phase output classification), but the tagging data confidence 152 may be weighted heuristically. For example, the confidence level of a classification output by the artificial intelligence model (e.g., 70% confidence that the target asset is in the possession/control of the friendly group) may be weighted based upon the tagging data confidence 152, such as by averaging the confidence level of the classification and the tagging data confidence, changing the confidence level of the classification to the tagging data confidence, etc. In other examples, both confidence levels may be output.

As yet another example, the tagging data 136 received during the training phase may be used as an input to the artificial intelligence model 144 such that the artificial intelligence model may be trained to infer the predicted result based at least in part upon run-time tagging data. The ground-truth output classification of the target asset may be provided by a super user who is authorized to label the input data with a ground-truth classification, or the ground-truth may be provided from some other suitable source. When the tagging data is used as an input to the model, it may not be used as ground-truth output, and vice versa.

In some examples, the artificial intelligence model 144 includes a neural network. The training may take place using any suitable method(s), such as by using backpropagation with gradient descent. As the neural network is trained, an input vector (e.g., a vector comprising a normalized form of the telemetry data 124) and matched ground truth labels (e.g., the tagging data 136), which can be classifications or scalar values, are applied to an input layer and an output layer respectively, and the weights in the network are computed through gradient descent and the backpropagation algorithm, for example, such that the trained neural network will properly classify (or properly value) the input vector to the matched ground truth classification or scalar value in the output layer. In other examples, any other suitable artificial intelligence model may be used, and the training may be semi-supervised or unsupervised. Another example system for classifying the possession and control of a target asset is discussed in more detail below with reference to FIGS. 4-6.

In a run-time implementation, one example of which is depicted in FIG. 2, the monitoring server 102 is further configured to monitor the run-time telemetry data 148 from the run-time target asset 146 during a run-time in-field event. The run-time target asset 146 corresponds to one of the training-phase in-field assets 108. For example the run-time target asset 146 may include a weapon 164, navigation equipment 166, communication equipment 168, surveillance equipment 170, or transportation equipment 172. The run-time target asset 146 further comprises computer hardware 174 configured to provide the run-time telemetry data 148 to the monitoring server 102 via the network 122. Additional details regarding the computing hardware 174 are provided below with reference to FIG. 7.

The run-time telemetry data 148 corresponds to the training-phase telemetry data 124. For example, the run-time telemetry data 148 may include run-time position data 154, orientation data 156, equipment status 158, biometric data 160, and targeting and live-fire activity data 162, which correspond to the training-phase position data 126, orientation data 128, equipment status 130, biometric data 132, and targeting and live-fire activity data 134, respectively.

The run-time telemetry data 148 is input into the trained artificial intelligence model 144, to thereby cause the artificial intelligence model 144 to output a predicted classification 150A-C of the run-time target asset 146 as being in the possession or control of the friendly or the unfriendly actor, or lost, respectively. In some examples, the run-time telemetry data 148 is used to populate an input feature vector 176 that may additionally or alternatively include run-time tagging data 178. The run-time tagging data 178 is received from computing hardware 180 of one or more in-field tagging assets 182 under the control of a member 104 of the friendly group. The run-time tagging data 178 corresponds to the training-phase tagging data 136 and comprises an indication that the run-time target asset 146 is in the possession or control of a friendly or unfriendly actor, or lost.

The artificial intelligence model 144 is trained to classify patterns in the input feature vector 176 to predict that the run-time target asset 146 is in the possession or control of a friendly or unfriendly actor, or lost. In the example of FIG. 2, the run-time target asset 146 is a friendly device that was previously in the possession and control of the friendly group. The asset 146 was stolen or hijacked and is now in the possession of the unfriendly group. However, the asset 146 continues to provide run-time telemetry data 148 to the monitoring server 102.

Accordingly, the run-time input feature vector 176 may include various indicators or patterns of inputs that indicate that the run-time target asset 146 was hijacked. For example, the hijacking may be detected by a user 104 monitoring a camera feed focused on the unfriendly group, and the user 104 may provide an indication that the target asset 146 was stolen in the run-time tagging data 178. In other examples, the run-time tagging data 178 may be programmatically generated (e.g., by a computing device using an image classification algorithm).

As another example, the biometric data 160 may indicate that a different person (e.g., a member 106 of the unfriendly group) has taken possession of the asset 146 or is attempting to control the asset. For example, a fingerprint reader located on a hand grip of the weapon 164 may not recognize the fingerprints of a person holding the weapon. The position data 154 may additionally or alternatively indicate that an asset 146 was taken from a location of the friendly group and is now located in an unfriendly area. Where the run-time target asset comprises the weapon 164, the orientation data 156 may indicate that the weapon 164 (which would be expected to point at the unfriendly actors 106) is now pointed at the friendly actors 104. In other examples, the target asset 146 may comprise a targeting system, and the targeting and live fire activity data 162 may indicate that the target asset 146 is being used to tag members 104 of the friendly group with a target classification of "unfriendly", which is an indicator that the target asset 146 is in the possession or control of the unfriendly actors. The artificial intelligence model 144 may detect patterns such as these in the input feature vector 176, and accordingly output a predicted classification 150B that the run-time target asset 146 is in the possession or control of an unfriendly actor 106. Alternatively, when the patterns in the input feature vector 176 correspond to patterns of friendly behavior, the artificial intelligence model 144 may output a predicted classification 150A that the run-time target asset 146 is in the possession or control of a friendly actor 104.

As another example, the run-time target asset 146 may comprise an imposter asset: an unfriendly asset that has been inserted into a friendly ecosystem. The unfriendly asset may be a native device that was originally in the possession and control of the unfriendly group, or the unfriendly asset may be a friendly device that was hijacked by one or more members of the unfriendly group and either re-inserted (in the case of an asset that was removed) or left (in the case of an asset that was hijacked in place, e.g., via a cyberattack) in the friendly ecosystem. For example, various assets of the friendly group may be electronically hijacked for sabotage or intelligence-gathering purposes (e.g., by gaining access to a drone's flight control and/or surveillance systems).

The imposter asset may remain in the control of the unfriendly group while appearing to be in the control of the friendly group. For example, the asset may continue transmitting telemetry data 148, although the asset may not respond to commands from a friendly actor 104. In other examples, there may be glitches, interruptions, or unusual patterns (e.g., loops of repeating data that do not change in response to inputs from the friendly actor) in the telemetry data 148 which may be detected by the artificial intelligence model 144. Accordingly, the artificial intelligence model 144 may output a predicted classification 150B that the run-time target asset 146 is in the possession or control of an unfriendly actor 106.

In another example, the run-time telemetry data 148 may comprise spoofed data that does not correspond to the true parameters of the run-time target asset 146, or the spoofed data may mimic a target asset 146 that does not exist. For example, the position data 154 may indicate that a target asset, such as a shipping vessel, is at a different location or took a different route than a true location or route of the vessel. Unusual patterns of behavior may trigger suspicion. For example, a query may be sent to the target asset, such as a request for the water temperature outside of the shipping vessel, that is not likely to be correct if the target asset is being spoofed. A reported water temperature of 75° F. may trigger suspicion if the telemetry data 148 indicates that the vessel is in the Arctic Ocean. Spoofing may also be recognized by performing checks in the real world to verify that the run-time telemetry data 148 is correct. For example, one or more friendly users 104 observing the real-world environment may indicate in the tagging data 178 that the run-time telemetry data 148 is incorrect, or the run-time target asset 146 does not exist. Accordingly, the artificial intelligence model 144 may output a predicted classification 150B that the run-time target asset 146 is in the possession or control of an unfriendly actor 106.

In some examples, the artificial intelligence model 144 is trained to recognize when the run-time target asset 146 is lost. For example, the position data reported by the run-time target asset 146 may be constant, while a friendly actor 104 formerly in possession of the target asset 146 has moved. In addition, the tagging data 178 may directly indicate that the target asset 146 is lost. In other examples, the tagging data 178 may omit the target asset 146, thereby suggesting that the target asset 146 is not in the possession or control of any of the friendly actors 104 or the unfriendly actors 106.

The predicted classification 150 may be output to any suitable device or combination of devices. For example, the predicted classification 150 may be output to a user interface device 186. The user interface device 186 may comprise an in-field computing device (e.g., a smartphone, a tablet, or a laptop computing device), or a remote computing device (e.g., a workstation in a remote command center). It will also be appreciated that the user interface device 186 may comprise any other suitable device or combination of devices configured to perform the functions described herein. The user interface device 186 may be configured to display or otherwise present the predicted classification 150 to a user via a display. In other examples, the predicted classification 150 can be output to any other suitable device or combination of devices, such a computing device for downstream processing.

In some examples, upon outputting the predicted classification 150 of the run-time target asset 146, the monitoring server 102 is configured to adjust a trust level 184 of the run-time target asset 146. For example, based upon outputting the predicted classification 150B that the run-time target asset 146 is in the possession or control of the unfriendly actor 106, or the predicted classification 150C that the run-time target asset 146 is lost, the monitoring server 102 may be configured to reduce the trust level 184. In contrast, based upon outputting the predicted classification 150A that the run-time target asset 146 is in the possession or control of a friendly actor, the monitoring server 102 may be configured to increase the trust level 184, or leave the trust level unchanged.

Upon determining that the trust level 184 of the run-time target asset is less than or equal to a threshold trust level 188, the monitoring server 102 may be configured to perform a remedial action 190. The remedial action 190 may include deactivating 192 the run-time target asset 146. For example, the monitoring server 102 may send a command to the run-time target asset 146 or another asset that exerts at least some control over the target asset 146 to destroy the target asset 146, render the target asset 146 inoperable, wipe data from the computer hardware 174, encrypt data on the computer hardware 174, etc.

In other examples, the remedial action 190 includes performing additional monitoring 194 of the run-time target asset 146. For example, the run-time telemetry data 148 of the target asset 146 may continue to be monitored while the target asset is in the possession or control of the unfriendly group as a form of reconnaissance to gain intelligence on the unfriendly group.

As yet another example, the monitoring server 102 may be configured to capture an image 196 of the run-time target asset 146 using one or more cameras 198. The one or more cameras 198 may be located in the field environment (e.g., as an asset under the control of the friendly group) or remote from the field environment (e.g., on board a satellite or an aerial drone).

In some examples, the image 196 is obtained based on the predicted classification 150 output by the artificial intelligence model 144. For example, the image 196 may be obtained based upon the artificial intelligence model outputting the predicted classification 150B that the run-time target asset 146 is in the possession or control of an unfriendly actor 106, to verify that the run-time telemetry data 148 is accurate. For example, the image 196 may be used to determine whether the run-time telemetry data 148 is spoofed or not, as introduced above. In other examples, the image 196 may be obtained and used as an input to the artificial intelligence model 144. For example, the image 196 may be processed by an image classifier and serve as tagging data 178.

Figure 3A:
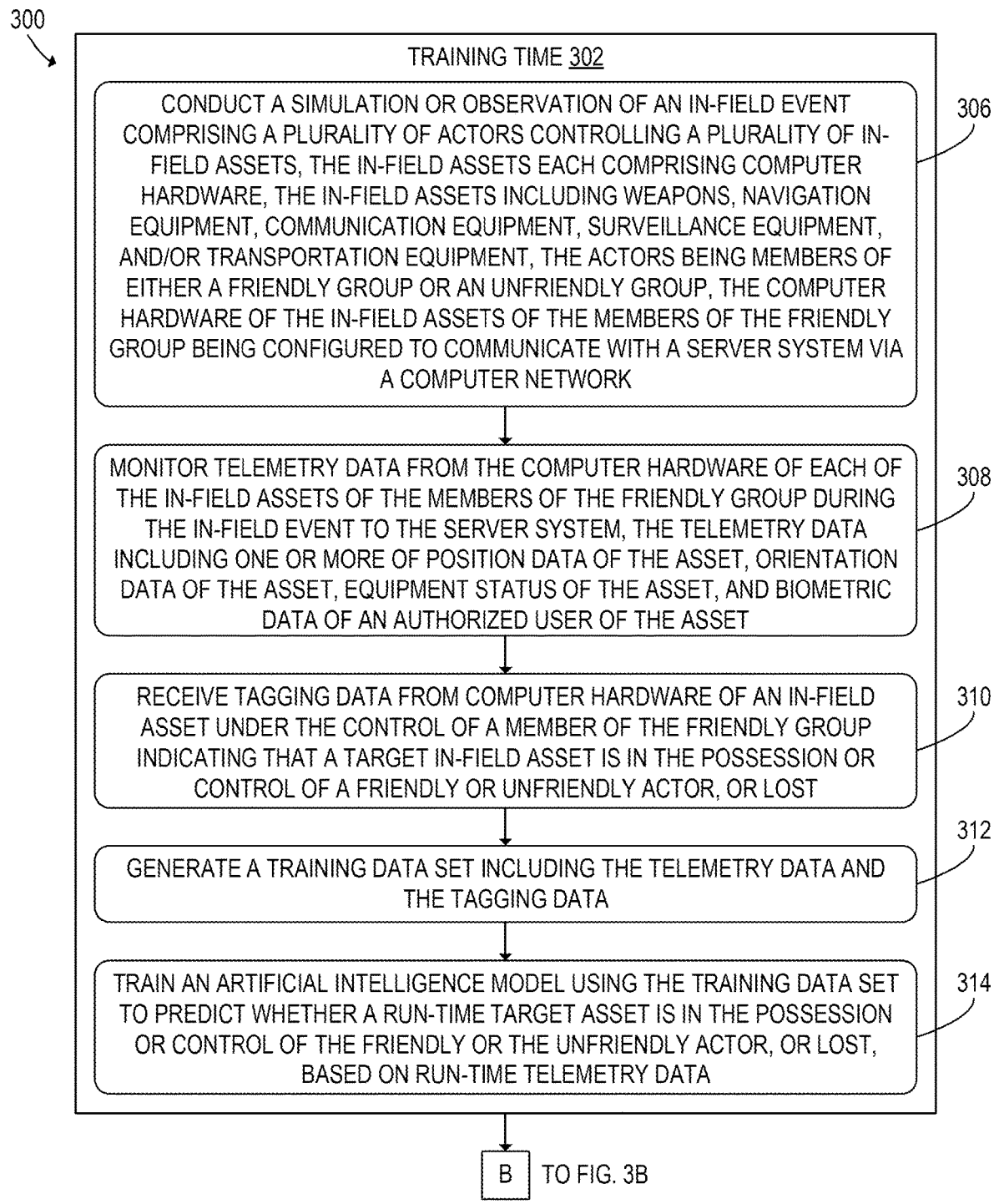
FIGS. 3A-3B show a flowchart of an example method for classifying the possession or control of a target asset, according to one example embodiment.
Figure 3B:
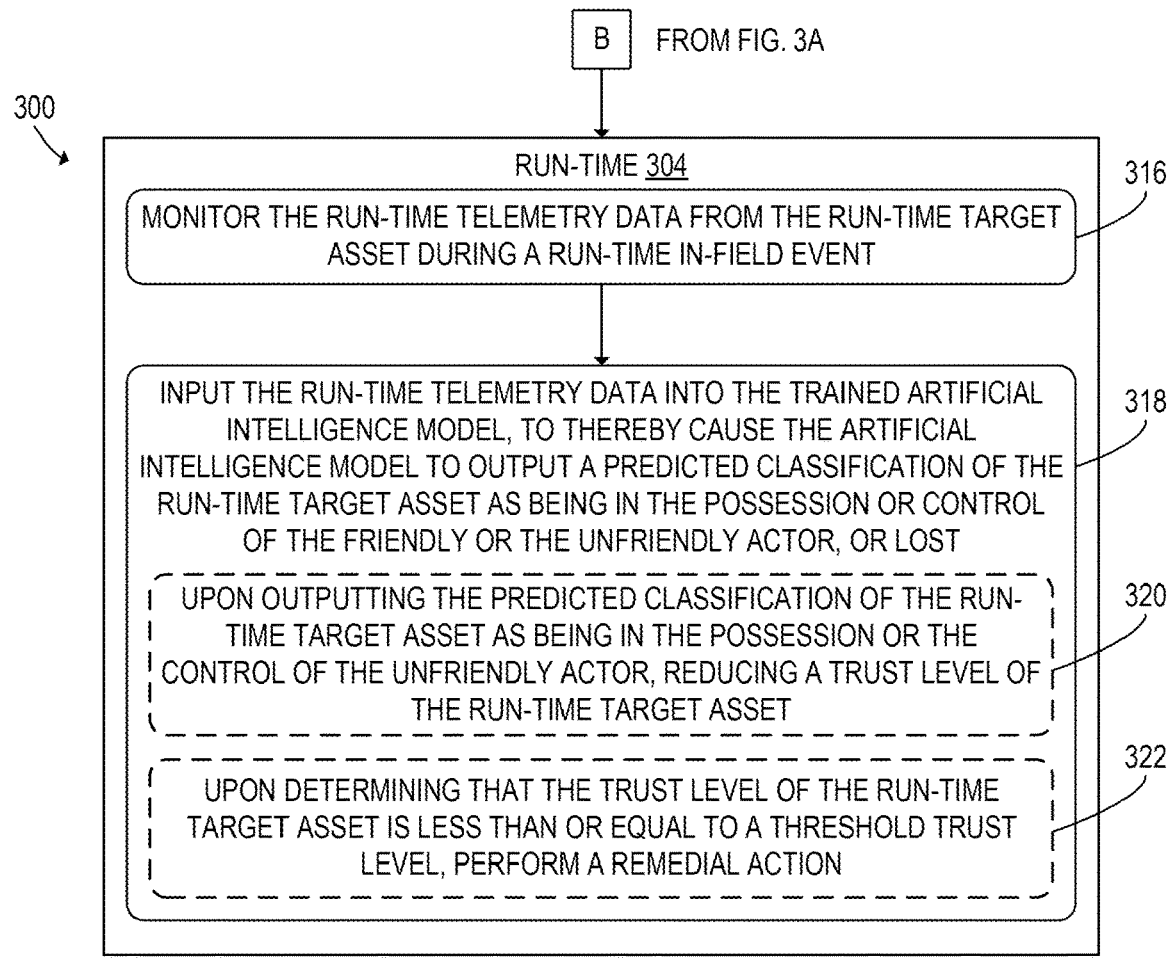

With reference now to FIGS. 3A-3B, a flowchart is illustrated depicting an example method 300 for classifying the possession or control of a target asset. The following description of method 300 is provided with reference to the software and hardware components described above and shown in FIGS. 1-2 and 4-7, and the method steps in method 300 will be described with reference to corresponding portions of FIGS. 1-2 and 4-7 below. It will be appreciated that method 300 also may be performed in other contexts using other suitable hardware and software components.

It will be appreciated that the following description of method 300 is provided by way of example and is not meant to be limiting. It will be understood that various steps of method 300 can be omitted or performed in a different order than described, and that the method 300 can include additional and/or alternative steps relative to those illustrated in FIGS. 3A and 4B without departing from the scope of this disclosure.

The method 300 includes steps performed at a training time 302, illustrated in FIG. 3A, and a runtime 304, illustrated in FIG. 3B. In some examples, the steps performed at the training time 302 occur in a training environment and the steps performed at runtime 304 occur in a deployed field environment. In other examples, at least a portion of the steps performed at the training time 302 and runtime 304 may occur concurrently or in the same environment.

Continuing with FIG. 3A, at 306 the method 300 comprises, at the training time 302, conducting a simulation or observation of an in-field event comprising a plurality of actors controlling a plurality of in-field assets, the in-field assets each comprising computer hardware, the in-field assets including weapons, navigation equipment, communication equipment, surveillance equipment, and/or transportation equipment, the actors being members of either a friendly group or an unfriendly group, the computer hardware of the in-field assets of the members of the friendly group being configured to communicate with a server system via a computer network. For example, the system 100 of FIG. 1 may be used to conduct the simulation or observation of the in-field event as described above.

The method 300 includes, at 308, monitoring telemetry data from the computer hardware of each of the in-field assets of the members of the friendly group during the in-field event, the telemetry data including one or more of position data of the asset, orientation data of the asset, equipment status of the asset, and biometric data of an authorized user of the asset. The method 300 includes, at 310, receiving tagging data from computer hardware of an in-field asset under the control of a member of the friendly group indicating that a target in-field asset is in the possession or control of a friendly or unfriendly actor, or lost. The method 300 includes, at 312, generating a training data set including the telemetry data and the tagging data. The method 300 includes, at 314, training an artificial intelligence model using the training data set to predict whether a run-time target asset is in the possession or control of the friendly or the unfriendly actor, or lost, based on run-time telemetry data.

With reference now to FIG. 3B, at 316 the method 300 comprises, at the runtime 304, monitoring the run-time telemetry data from the run-time target asset during a run-time in-field event. The method 300 includes, at 318, inputting the run-time telemetry data into the trained artificial intelligence model, to thereby cause the artificial intelligence model to output a predicted classification of the run-time target asset as being in the possession or control of the friendly or the unfriendly actor, or lost.

At 320, the method 300 may include, upon outputting the predicted classification of the run-time target asset as being in the possession or the control of the unfriendly actor, reducing a trust level of the run-time target asset. At 322, the method 300 may include, upon determining that the trust level of the run-time target asset is less than or equal to a threshold trust level, performing a remedial action.

Figure 4:
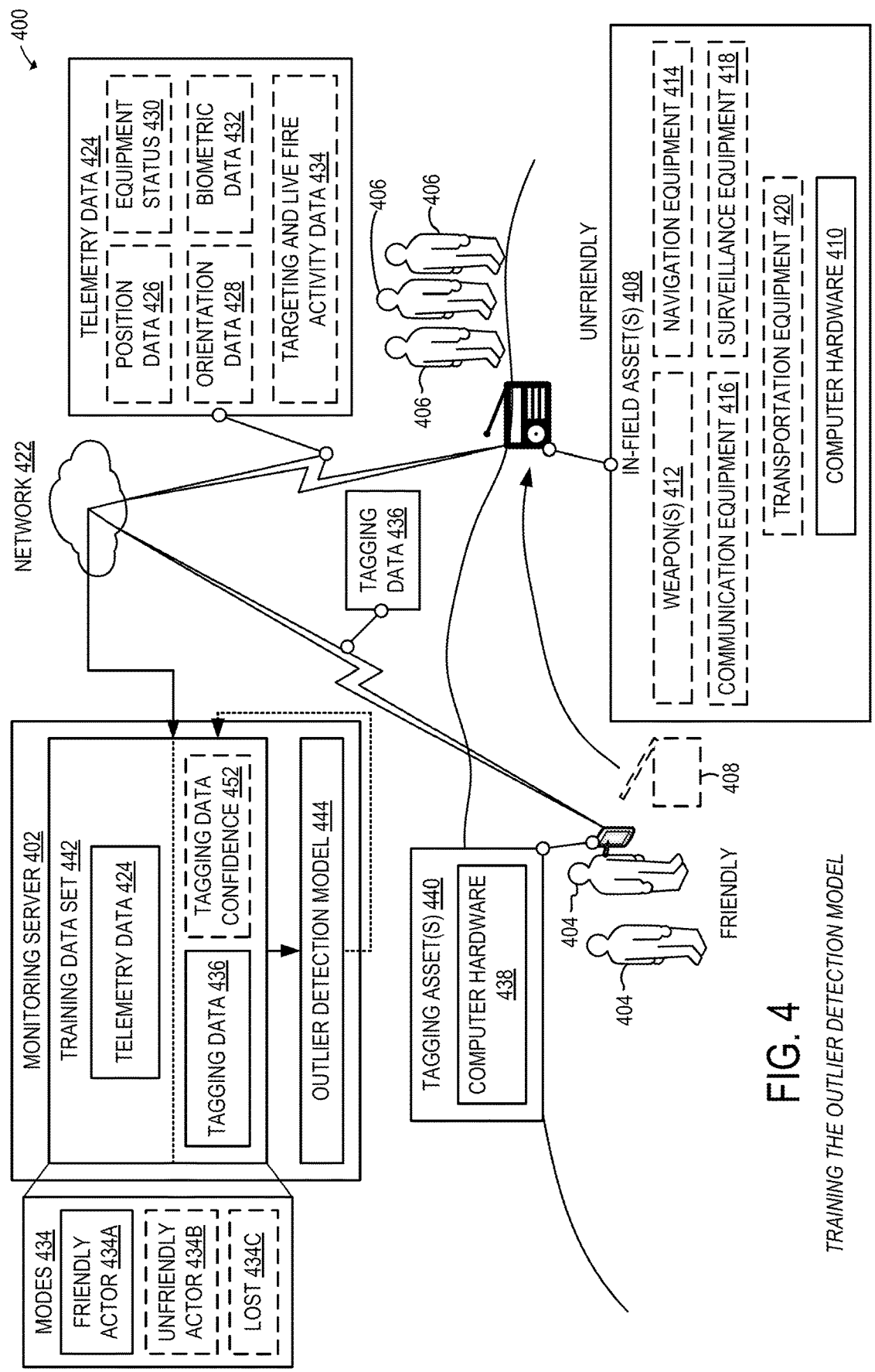
FIG. 4 shows another example of a system for classifying the possession or control of a target asset during a training-time simulation or observation of an in-field event comprising a plurality of actors controlling a plurality of in-field assets.

In other examples, and as described in more detail below, the possession or control of the target asset is classified using an outlier detection model. FIG. 4 shows one such example of a system 400 for classifying the possession or control of a target asset using an outlier detection model. Like the system 100 of FIG. 1, the system 400 of FIG. 4 comprises one or more computing devices (e.g., monitoring server 402) having processors and associated memories storing instructions executable by the processors. The instructions are executable to, at a training time, conduct a simulation or observation of an in-field event comprising a plurality of actors 404, 406 controlling a plurality of in-field assets 408. The in-field assets 408 each comprise computer hardware 410, and the in-field assets 408 include weapons 412, navigation equipment 414, communication equipment 416, surveillance equipment 418, and/or transportation equipment 420. The actors 404, 406 are members of either a friendly group or an unfriendly group, respectively, and the computer hardware 410 of the in-field assets 408 of the members 404 of the friendly group is configured to communicate with a server system 402 via a computer network 422. The system 400 is further configured to monitor telemetry data 424 from the computer hardware 410 of each of the in-field assets 408 of the members 404 of the friendly group during the in-field event. The telemetry data 424 includes one or more of position data 426 of the asset, orientation data 428 of the asset, equipment status 430 of the asset, and biometric data 432 of an authorized user of the asset. A training data set 442 is generated including the telemetry data 424.

The monitoring server 402 may be configured to, at the training time, receive tagging data 436 from computer hardware 438 of one or more in-field tagging assets 440 under the control of a member 404 of the friendly group indicating that a target in-field asset 408 is in the possession or control of the friendly actor 404. As described in more detail below, the training of the outlier detection model may be supervised or semi-supervised using the tagging data 436. The training data set 442 may additionally or alternatively include a confidence value 452 associated with the tagging data 436.

The outlier detection model 444 is trained using the training data set 442 to learn one or more modes 434 in the training data set 442. The one or more modes include a mode 434A corresponding to an in-field asset 408 that is in the possession or control of a friendly actor. In some examples, the one or more modes 434 further comprise a mode 434B corresponding to an in-field asset that is in the possession or control of an unfriendly actor, or a mode 434C corresponding to an in-field asset that is lost.

The outlier detection model 444 is trained to classify the training input data as belonging to one or more clusters, with each cluster corresponding to one of the one or more modes 434. As described in more detail below with reference to FIG. 5, for each input vector, the outlier detection model 444 is configured to output a cluster classification 450 and a proximity 451 to the cluster center, such as a data distance to the cluster center or a percentage distance to the cluster center.

In one example, the outlier detection model 444 comprises a neural network, such as a deep neural network (DNN). In some examples, the neural network is trained using the tagging data 436 to label at least a portion of the telemetry data 424. In other examples, the outlier detection model 444 comprises an unsupervised neural network. The neural network (supervised, unsupervised, or semi-supervised) creates a feature map containing clusters of the training input data, with each cluster having a center (i.e., centroid) and a cluster identifier. After training, when run-time input is passed through the trained unsupervised neural network, it produces an output 453 containing the cluster ID 450 and proximity 451 of the run-time input to the cluster centroid.

As another example, the outlier detection model 444 comprises a cluster analysis algorithm that clusters the extracted features by a clustering technique, such as k-means clustering. In addition to k-means clustering, the cluster analysis algorithm of the outlier detection model 444 can implement one or more of hierarchical clustering, mixture modeling, a DBSCAN (Density-Based Spatial Clustering of Applications with Noise) algorithm, and an OPTICS (Ordering Points To Identify the Clustering Structure) algorithm. The output 453 of the clustering algorithm is a cluster identifier 450 and a metric indicating the proximity 451 to a center of the cluster, for each input vector 476.

At run-time, run-time telemetry data 448 from a run-time target asset 446 is monitored during a run-time in-field event. As introduced above, the run-time telemetry data 448 is input into the trained outlier detection model 444, to thereby cause the outlier detection model 444 to output an indication of whether the run-time telemetry data is within a predetermined proximity 464 of a centroid of a cluster 450 defining the mode 434A corresponding to the in-field asset 408 that is in the possession or control of the friendly actor 404, or the run-time telemetry data 448 is an outlier 466 from the mode 434A. In some examples, the run-time telemetry data 448 is used to populate an input feature vector 476 that may additionally or alternatively include run-time tagging data 478. The run-time tagging data 478 is received from computing hardware 480 of one or more in-field tagging assets 482 under the control of a member 404 of the friendly group. The run-time tagging data 478 corresponds to the training-phase tagging data 436 and comprises an indication that the run-time target asset 446 is in the possession or control of the friendly actor 404 or not (e.g., when the input vector is an outlier).

In some examples, determining that the run-time telemetry data 448 is an outlier 466 from the mode 434A comprises determining that the proximity 451 of the data vector to the centroid defining the mode 434A of the friendly actor 404 is greater than or equal to the predetermined proximity 464. In other examples, determining that the run-time telemetry data 448 is an outlier 466 from the mode 434A comprises determining that the data vector has a closer proximity 451 to the mode 434B of the unfriendly actor or the mode 434C of a lost asset than its proximity to the mode 434A.

Upon outputting the predicted classification of the run-time target asset 446 as being the outlier 466 from the mode 434A, the system 400 is configured to reduce a trust level 484 of the run-time target asset. The predicted classification and/or the trust level are used as described above with reference to the system 100. In this manner, the system 400 may allow in-field assets to be used in a versatile manner among friendly users, while protecting the in-field assets from unfriendly individuals or groups.

Figure 6A:
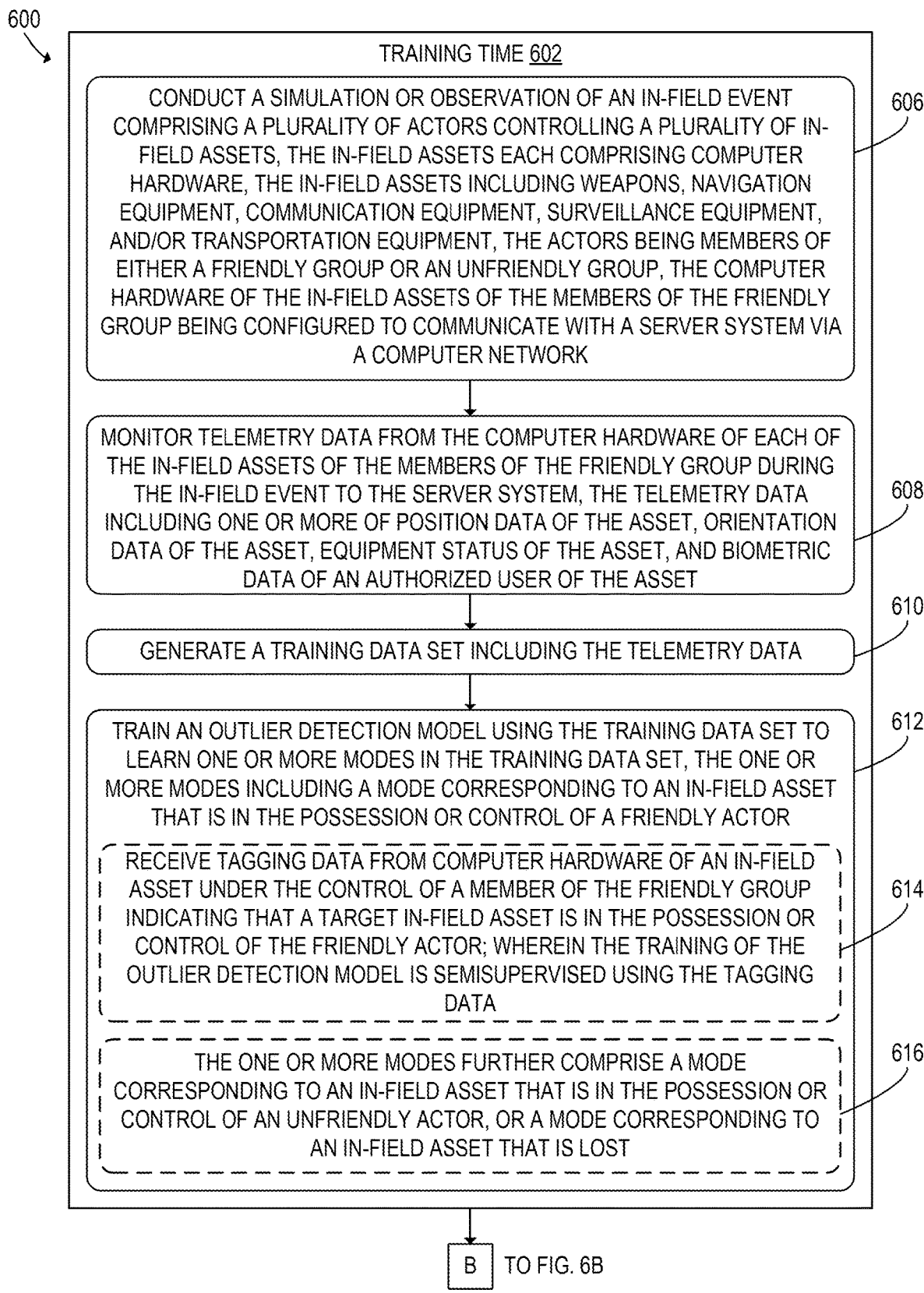
FIGS. 6A-6B show a flowchart of another example method for classifying the possession or control of a target asset, according to one example embodiment.
Figure 6B:
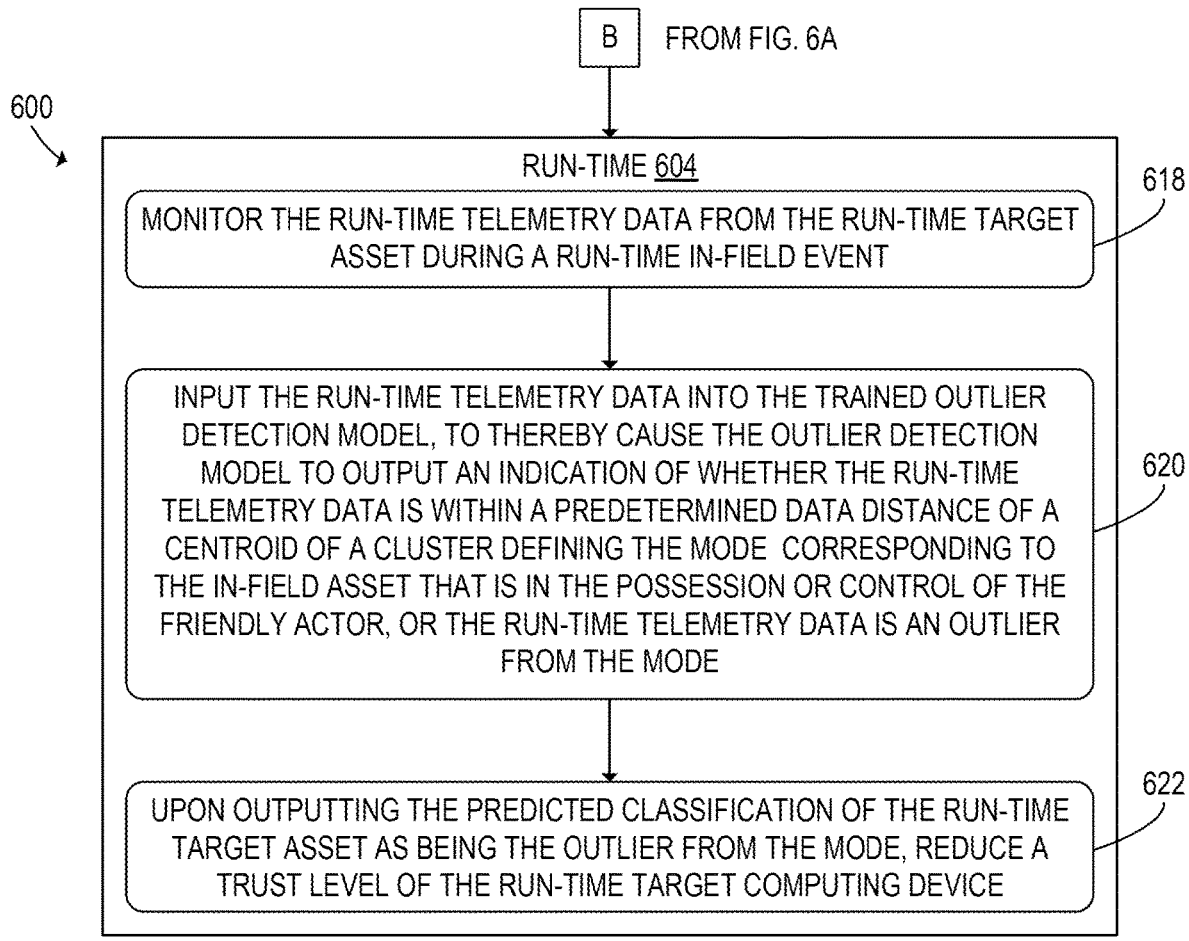

With reference now to FIGS. 6A-6B, a flowchart is illustrated depicting an example method 600 for classifying the possession or control of a target asset. The following description of method 600 is provided with reference to the software and hardware components described above and shown in FIGS. 1-5 and 7, and the method steps in method 600 will be described with reference to corresponding portions of FIGS. 1-5 and 7 below. It will be appreciated that method 600 also may be performed in other contexts using other suitable hardware and software components.

It will be appreciated that the following description of method 600 is provided by way of example and is not meant to be limiting. It will be understood that various steps of method 600 can be omitted or performed in a different order than described, and that the method 600 can include additional and/or alternative steps relative to those illustrated in FIGS. 6A and 6B without departing from the scope of this disclosure.

The method 600 includes steps performed at a training time 602, illustrated in FIG. 6A, and a runtime 604, illustrated in FIG. 6B. In some examples, the steps performed at the training time 602 occur in a training environment and the steps performed at runtime 604 occur in a deployed field environment. In other examples, at least a portion of the steps performed at the training time 602 and runtime 604 may occur concurrently or in the same environment.

Continuing with FIG. 6A, at 606, the method 600 comprises, at the training time 602, conducting a simulation or observation of an in-field event comprising a plurality of actors controlling a plurality of in-field assets, the in-field assets each comprising computer hardware, the in-field assets including weapons, navigation equipment, communication equipment, surveillance equipment, and/or transportation equipment, the actors being members of either a friendly group or an unfriendly group, the computer hardware of the in-field assets of the members of the friendly group being configured to communicate with a server system via a computer network. For example, the system 400 of FIG. 1 may be used to conduct the simulation or observation of the in-field event as described above.

The method 600 includes, at 608, monitoring telemetry data from the computer hardware of each of the in-field assets of the members of the friendly group during the in-field event, the telemetry data including one or more of position data of the asset, orientation data of the asset, equipment status of the asset, and biometric data of an authorized user of the asset. The method 600 includes, at 610, generating a training data set including the telemetry data. The method 600 includes, at 612, training an outlier detection model using the training data set to learn one or more modes in the training data set, the one or more modes including a mode corresponding to an in-field asset that is in the possession or control of a friendly actor.

At 614, the method 600 may include, at the training time 602, receiving tagging data from computer hardware of an in-field asset under the control of a member of the friendly group indicating that a target in-field asset is in the possession or control of the friendly actor; wherein the training of the outlier detection model is semisupervised using the tagging data.

At 616, the one or more modes may comprise a mode corresponding to an in-field asset that is in the possession or control of an unfriendly actor, or a mode corresponding to an in-field asset that is lost.

With reference now to FIG. 6B, at 618, the method 600 includes monitoring run-time telemetry data from a run-time target asset during a run-time in-field event. The method 600 includes, at 620, inputting the run-time telemetry data into the trained outlier detection model, to thereby cause the outlier detection model to output an indication of whether the run-time telemetry data is within a predetermined data distance of a centroid of a cluster defining the mode corresponding to the in-field asset that is in the possession or control of the friendly actor, or the run-time telemetry data is an outlier from the mode. The method 600 includes, at 622, upon outputting the predicted classification of the run-time target asset as being the outlier from the mode, reducing a trust level of the run-time target computing device.

In some embodiments, the methods and processes described herein may be tied to a computing system of one or more computing devices. In particular, such methods and processes may be implemented as a computer-application program or service, an application-programming interface (API), a library, and/or other computer-program product.

Figure 7:
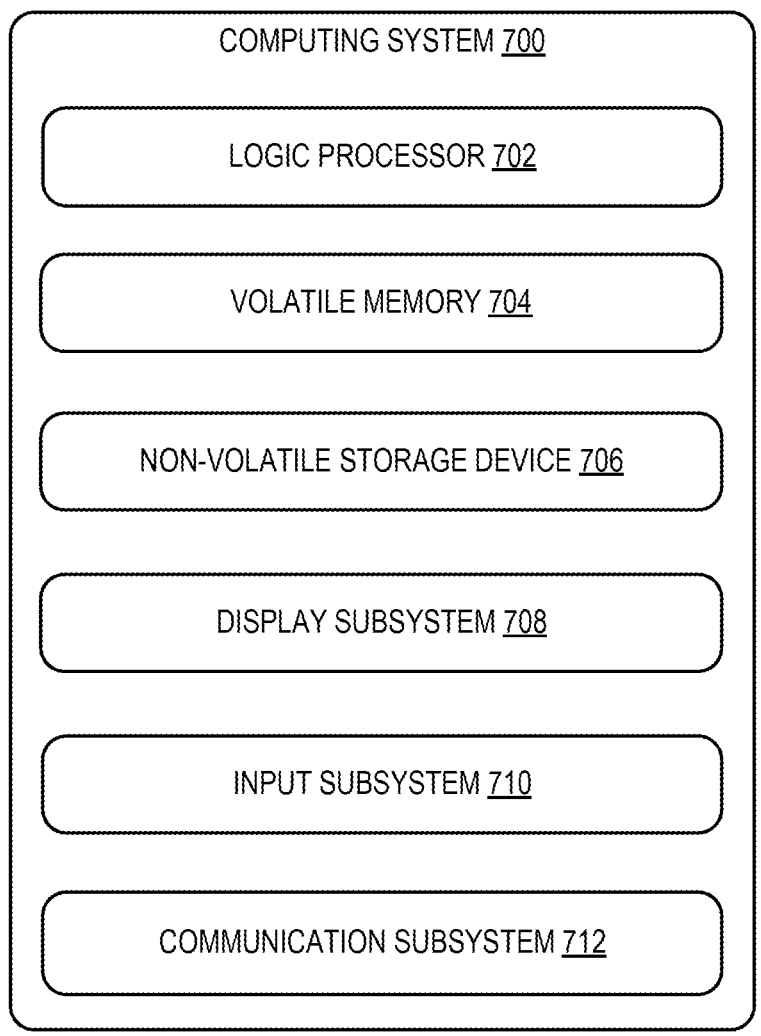
FIG. 7 shows a schematic diagram of an example computing system, according to one example embodiment.

FIG. 7 schematically shows an example of a computing system 700 that can enact one or more of the devices and methods described above. Computing system 700 is shown in simplified form. Computing system 700 may take the form of one or more personal computers, server computers, tablet computers, home-entertainment computers, network computing devices, gaming devices, mobile computing devices, mobile communication devices (e.g., smart phone), and/or other computing devices, and wearable computing devices such as smart wristwatches and head mounted augmented reality devices. In some examples, the computing system 700 may embody the monitoring server 102, the tagging asset(s) 140, or the in-field asset(s) 108 of FIGS. 1-2, the user device 186 of FIG. 2, the monitoring server 402, the tagging asset(s) 440, or the in-field asset(s) 408 of FIGS. 4-5.

The computing system 700 includes a logic processor 702 volatile memory 704, and a non-volatile storage device 706. The computing system 700 may optionally include a display subsystem 708, input subsystem 710, communication subsystem 712, and/or other components not shown in FIG. 7.

Logic processor 702 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 702 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 706 includes one or more physical devices configured to hold instructions executable by the logic processors to implement the methods and processes described herein. When such methods and processes are implemented, the state of non-volatile storage device 706 may be transformed—e.g., to hold different data.

Non-volatile storage device 706 may include physical devices that are removable and/or built in. Non-volatile storage device 706 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 706 may include nonvolatile, dynamic, static, read/write, read-only, sequential-access, location-addressable, file-addressable, and/or content-addressable devices. It will be appreciated that non-volatile storage device 706 is configured to hold instructions even when power is cut to the non-volatile storage device 706.

Volatile memory 704 may include physical devices that include random access memory. Volatile memory 704 is typically utilized by logic processor 702 to temporarily store information during processing of software instructions. It will be appreciated that volatile memory 704 typically does not continue to store instructions when power is cut to the volatile memory 704.

Aspects of logic processor 702, volatile memory 704, and non-volatile storage device 706 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system 700 typically implemented in software by a processor to perform a particular function using portions of volatile memory, which function involves transformative processing that specially configures the processor to perform the function. Thus, a program may be instantiated via logic processor 702 executing instructions held by non-volatile storage device 706, using portions of volatile memory 704. It will be understood that different programs may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

When included, display subsystem 708 may be used to present a visual representation of data held by non-volatile storage device 706. The visual representation may take the form of a GUI. As the herein described methods and processes change the data held by the non-volatile storage device, and thus transform the state of the non-volatile storage device, the state of display subsystem 708 may likewise be transformed to visually represent changes in the underlying data. Display subsystem 708 may include one or more display devices utilizing virtually any type of technology. Such display devices may be combined with logic processor 702, volatile memory 704, and/or non-volatile storage device 706 in a shared enclosure, or such display devices may be peripheral display devices.

When included, input subsystem 710 may comprise or interface with one or more user-input devices such as a keyboard, mouse, touch screen, or game controller. In some examples, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity; and/or any other suitable sensor.

When included, communication subsystem 712 may be configured to communicatively couple various computing devices described herein with each other, and with other devices. Communication subsystem 712 may include wired and/or wireless communication devices compatible with one or more different communication protocols. For example, the communication subsystem may be configured for communication via a wireless telephone network, or a wired or wireless local- or wide-area network. In some examples, the communication subsystem may allow computing system 700 to send and/or receive messages to and/or from other devices via a network such as the Internet.

It will be understood that the configurations and/or approaches described herein are exemplary in nature, and that these specific embodiments or examples are not to be considered in a limiting sense, because numerous variations are possible. The specific routines or methods described herein may represent one or more of any number of strategies. As such, various acts illustrated and/or described may be performed in the sequence illustrated and/or described, in other sequences, in parallel, or omitted. Likewise, the order of the above-described methods may be changed.

The subject matter of the present disclosure includes all novel and non-obvious combinations and sub-combinations of the various methods, systems and configurations, and other features, functions, acts, and/or properties disclosed herein, as well as any and all equivalents thereof.

The invention claimed is:

1. A system, comprising:
one or more computing devices having processors and associated memories storing instructions executable by the processors to:
at training time:
conduct a simulation or observation of an in-field event comprising a plurality of actors controlling a plurality of in-field assets, the in-field assets each comprising computer hardware, the in-field assets including weapons, navigation equipment, communication equipment, surveillance equipment, and/or transportation equipment, the actors being members of either a friendly group or an unfriendly group, the computer hardware of the in-field assets of the members of the friendly group being configured to communicate with a server system via a computer network;
monitor telemetry data from the computer hardware of each of the in-field assets of the members of the friendly group during the in-field event, the telemetry data including one or more of position data of the asset, orientation data of the asset, equipment status of the asset, and biometric data of an authorized user of the asset;
receive tagging data from computer hardware of an in-field asset under the control of a member of the friendly group indicating that a target in-field asset is in the possession or control of a friendly or unfriendly actor, or lost;
generate a training data set including the telemetry data and the tagging data; and
train an artificial intelligence model using the training data set to predict whether a run-time target asset is in the possession or control of the friendly or the unfriendly actor, or lost, based on run-time telemetry data; and at run-time:
monitor the run-time telemetry data from the run-time target asset during a run-time in-field event; and input the run-time telemetry data into the trained artificial intelligence model, to thereby cause the artificial intelligence model to output a predicted classification of the run-time target asset as being in the possession or control of the friendly or the unfriendly actor, or lost.

2. The system of claim 1, wherein monitoring the telemetry data comprises monitoring targeting and live fire activity data of members of the friendly group and unfriendly group during the in-field event.

3. The system of claim 1, wherein the instructions are further executable to, upon outputting the predicted classification of the run-time target asset as being in the possession or the control of the unfriendly actor, reduce a trust level of the run-time target asset.

4. The system of claim 3, wherein the instructions are further executable to, upon determining that the trust level of the run-time target asset is less than or equal to a threshold trust level, perform a remedial action.

5. The system of claim 4, wherein performing the remedial action comprises deactivating the run-time target asset or performing additional monitoring of the run-time target asset.

6. The system of claim 1, wherein the instructions are further executable to capture an image of the run-time target asset during the run-time in-field event using one or more cameras.

7. At a computing device, a method for classifying the possession or control of a target asset, the method comprising:

at training time:
conducting a simulation or observation of an in-field event comprising a plurality of actors controlling a plurality of in-field assets, the in-field assets each comprising computer hardware, the in-field assets including weapons, navigation equipment, communication equipment, surveillance equipment, and/or transportation equipment, the actors being members of either a friendly group or an unfriendly group, the computer hardware of the in-field assets of the members of the friendly group being configured to communicate with a server system via a computer network;

monitoring telemetry data from the computer hardware of each of the in-field assets of the members of the friendly group during the in-field event, the telemetry data including one or more of position data of the asset, orientation data of the asset, equipment status of the asset, and biometric data of an authorized user of the asset;

receiving tagging data from computer hardware of an in-field asset under the control of a member of the friendly group indicating that a target in-field asset is in the possession or control of a friendly or unfriendly actor, or lost;

generating a training data set including the telemetry data and the tagging data; and training an artificial intelligence model using the training data set to predict whether a run-time target asset is in the possession or control of the friendly or the unfriendly actor, or lost, based on run-time telemetry data; and at run-time:
monitoring the run-time telemetry data from the run-time target asset during a run-time in-field event; and inputting the run-time telemetry data into the trained artificial intelligence model, to thereby cause the artificial intelligence model to output a predicted classification of the run-time target asset as being in the possession or control of the friendly or the unfriendly actor, or lost.

8. The method of claim 7, further comprising, upon outputting the predicted classification of the run-time target asset as being in the possession or the control of the unfriendly actor, reducing a trust level of the run-time target asset.

9. The method of claim 8, further comprising, upon determining that the trust level of the run-time target asset is less than or equal to a threshold trust level, performing a remedial action.

10. A system, comprising:
one or more computing devices having processors and associated memories storing instructions executable by the processors to:

at training time:
conduct a simulation or observation of an in-field event comprising a plurality of actors controlling a plurality of in-field assets, the in-field assets each comprising computer hardware, the in-field assets including weapons, navigation equipment, communication equipment, surveillance equipment, and/or transportation equipment, the actors being members of either a friendly group or an unfriendly group, the computer hardware of the in-field assets of the members of the friendly group being configured to communicate with a server system via a computer network;

monitor telemetry data from the computer hardware of each of the in-field assets of the members of the friendly group during the in-field event, the telemetry data including one or more of position data of the asset, orientation data of the asset, equipment status of the asset, and biometric data of an authorized user of the asset;

generate a training data set including the telemetry data; and train an outlier detection model using the training data set to learn one or more modes in the training data set, the one or more modes including a mode corresponding to an in-field asset that is in the possession or control of a friendly actor;

at run-time:
monitor run-time telemetry data from a run-time target asset during a run-time in-field event;

input the run-time telemetry data into the trained outlier detection model, to thereby cause the outlier detection model to output a predicted classification of whether the run-time telemetry data is within a predetermined data distance of a centroid of a cluster defining the mode corresponding to the in-field asset that is in the possession or control of the friendly actor, or the run-time telemetry data is an outlier from the mode; and upon outputting the predicted classification of the run-time target asset as being the outlier from the mode, reduce a trust level of the run-time target asset.

11. The system of claim 10, wherein the instructions are further executable to:
at the training time, receive tagging data from computer hardware of an in-field asset under the control of a member of the friendly group indicating that a target in-field asset is in the possession or control of the friendly actor;
wherein the training of the outlier detection model is semisupervised using the tagging data.

12. The system of claim 11, further comprising, at the training time, receive tagging data from computer hardware of the in-field asset under the control of the member of the friendly group indicating that the target in-field asset is in the possession or control of the unfriendly group, or lost.

13. The system of claim 10, wherein the one or more modes further comprise a mode corresponding to an in-field asset that is in the possession or control of an unfriendly actor, or a mode corresponding to an in-field asset that is lost.

14. The system of claim 10, wherein the instructions are further executable to capture an image of the run-time target asset during the run-time in-field event using one or more cameras.

15. The system of claim 10, wherein monitoring the telemetry data comprises monitoring targeting and live fire activity data of members of the friendly group and unfriendly group during the in-field event.

16. The system of claim 10, wherein the instructions are further executable to, upon determining that the trust level of the run-time target asset is less than or equal to a threshold trust level, perform a remedial action.

17. The system of claim 16, wherein performing the remedial action comprises deactivating the run-time target asset or performing additional monitoring of the run-time target asset.

18. At a computing device, a method for classifying the possession or control of a target asset, the method comprising:
at training time:
conducting a simulation or observation of an in-field event comprising a plurality of actors controlling a plurality of in-field assets, the in-field assets each comprising computer hardware, the in-field assets including weapons, navigation equipment, communication equipment, surveillance equipment, and/or transportation equipment, the actors being members of either a friendly group or an unfriendly group, the computer hardware of the in-field assets of the members of the friendly group being configured to communicate with a server system via a computer network;
monitoring telemetry data from the computer hardware of each of the in-field assets of the members of the friendly group during the in-field event, the telemetry data including one or more of position data of the asset, orientation data of the asset, equipment status of the asset, and biometric data of an authorized user of the asset;
generating a training data set including the telemetry data; and
training an outlier detection model using the training data set to learn one or more modes in the training data set, the one or more modes including a mode corresponding to an in-field asset that is in the possession or control of a friendly actor;
at run-time:
monitoring run-time telemetry data from a run-time target asset during a run-time in-field event;
inputting the run-time telemetry data into the trained outlier detection model, to thereby cause the outlier detection model to output an indication of whether the run-time telemetry data is within a predetermined data distance of a centroid of a cluster defining the mode corresponding to the in-field asset that is in the possession or control of the friendly actor, or the run-time telemetry data is an outlier from the mode; and
upon outputting the predicted classification of the run-time target asset as being the outlier from the mode, reducing a trust level of the run-time target asset.

19. The method of claim 18, further comprising:
at the training time, receiving tagging data from computer hardware of an in-field asset under the control of a member of the friendly group indicating that a target in-field asset is in the possession or control of the friendly actor;
wherein the training of the outlier detection model is semisupervised using the tagging data.

20. The method of claim 18, wherein the one or more modes further comprise a mode corresponding to an in-field asset that is in the possession or control of an unfriendly actor, or a mode corresponding to an in-field asset that is lost.

* * * * *